United States Patent
Maltby

(10) Patent No.: US 8,603,250 B2
(45) Date of Patent: Dec. 10, 2013

(54) SYSTEM AND METHOD FOR DEPOSITION OF A MATERIAL ON A SUBSTRATE

(75) Inventor: Michael G. Maltby, Wayne, OH (US)

(73) Assignee: First Solar, Inc., Perrysburg, OH (US)

( * ) Notice: Subject to any disclaimer, the term of this patent is extended or adjusted under 35 U.S.C. 154(b) by 629 days.

(21) Appl. No.: 11/752,054

(22) Filed: May 22, 2007

(65) Prior Publication Data

US 2008/0044571 A1    Feb. 21, 2008

Related U.S. Application Data

(60) Provisional application No. 60/805,947, filed on Jun. 27, 2006.

(51) Int. Cl.
    *C23C 16/00*      (2006.01)

(52) U.S. Cl.
    USPC .......................................... 118/729; 118/715

(58) Field of Classification Search
    USPC ........................................................ 118/729
    See application file for complete search history.

(56) References Cited

U.S. PATENT DOCUMENTS

| | | | | |
|---|---|---|---|---|
| 4,883,506 | A | * | 11/1989 | Ribnitz ............................. 95/278 |
| 5,080,774 | A | * | 1/1992 | Heitzer ....................... 204/298.11 |
| 5,725,672 | A | * | 3/1998 | Schmitt et al. ................. 118/715 |
| 5,772,715 | A | | 6/1998 | McMaster et al. |
| 5,779,804 | A | | 7/1998 | Mikoshiba et al. |
| 5,876,474 | A | | 3/1999 | Maltby, Jr. et al. |
| 5,945,163 | A | | 8/1999 | Powell et al. |
| 6,037,241 | A | | 3/2000 | Powell et al. |
| 6,074,487 | A | | 6/2000 | Yoshioka et al. |
| 6,092,669 | A | | 7/2000 | Kushiya et al. |
| 6,372,538 | B1 | * | 4/2002 | Wendt et al. ..................... 438/95 |
| 6,719,848 | B2 | | 4/2004 | Faykosh et al. |
| 7,194,197 | B1 | | 3/2007 | Wendt et al. |
| 2004/0154748 | A1 | * | 8/2004 | Rich et al. ................. 156/345.51 |
| 2004/0168907 | A1 | * | 9/2004 | Sato ............................ 204/192.1 |
| 2005/0001527 | A1 | * | 1/2005 | Sugiyama ................ 313/231.31 |

FOREIGN PATENT DOCUMENTS

EP      1 340 838 A1      9/2003

* cited by examiner

*Primary Examiner* — Keath Chen
(74) *Attorney, Agent, or Firm* — Dickstein Shapiro LLP

(57) ABSTRACT

A method and apparatus for improving coating of a substrate.

16 Claims, 1 Drawing Sheet

SYSTEM AND METHOD FOR DEPOSITION OF A MATERIAL ON A SUBSTRATE

CLAIM OF PRIORITY

This application claims priority under 35 U.S.C. §119(e) to Provisional U.S. Patent Application Ser. No. 60/805,947 filed on Jun. 27, 2006, which is hereby incorporated by reference.

TECHNICAL FIELD

The present invention relates to a method and apparatus for depositing a film on a substrate.

BACKGROUND

Material deposition on a substrate, such as glass, can be typically performed on roller conveyed plates, continuous ribbons or on systems with a conveyor that provide a solid backplane. Disturbances in the geometry or air flow of such material deposition systems can result in changes in film uniformity or film properties.

SUMMARY

A method of reducing edge effects in vapor deposition can include introducing a fixed substantially flat surface opposite a deposition nozzle in a vapor deposition system. A method of reducing edge effects in vapor deposition can include introducing an exhaust basket opposite a deposition nozzle in a vapor deposition system, the exhaust basket having an intake surface extending beyond the width of a substrate when present. These methods can be implemented by system including substantially flat surface opposite the nozzle.

In one aspect, a system for depositing a material on a substrate includes a deposition nozzle configured to introduce a vapor of a material toward a surface of a substrate, a transport mechanism configured to transport the substrate past the nozzle, and a first substantially flat surface opposite the nozzle and in a void region between elements of a transport mechanism. The system can include a second substantially flat surface in a second void region between elements of a transport mechanism and adjacent to the first substantially flat surface. Optionally, the system can include three or more substantially flat surfaces in the void regions between elements of the transport mechanism. The system can include an exhaust basket opposite the nozzle.

In another aspect, a method for improving film uniformity on a substrate including placing a substantially flat surface opposite the nozzle and in a void region between elements of a transport mechanism, and introducing a vapor through a nozzle toward the substantially flat surface.

In another aspect, a vapor deposition system includes a vapor nozzle positioned above a substrate, substantially flat surfaces opposite the nozzle, the substrate positioned above substantially flat surfaces, wherein the substantially flat surfaces are placed in between a substrate transport mechanism, and an exhaust basket positioned beneath the substantially flat surfaces. The exhaust basket can be connected to a source of reduced pressure.

A plane tangential to the transport mechanism can be offset between 0.1 to 10 mm from the substantially flat surface. The substantially flat surface can include graphite or boron nitride. The substantially flat surface can be removable. The substantially flat surface can extend beyond the width of the substrate when present. The substantially flat surfaces can have adjustable positions. The substantially flat surfaces can extend beyond the nozzle to the region of the environmental containment flows.

The exhaust basket can be connected to a source of reduced pressure. The exhaust basket can be positioned beneath the substantially flat surface, can extend beyond the substantially flat surface in one dimension, and can extend beyond the substantially flat surface in a second dimension. For example, the exhaust basket can have a length that is longer than the dimension of the substantially flat surface and a width that is wider than the substantially flat surface and the transport mechanism or substantially flat surface. The exhaust basket can include an adjustment bar extending across the basket. The substantially flat surface can be adjustably attached to the bar. The exhaust basket can include a removable base. A plurality of substantially flat surfaces can be positioned in a plurality of corresponding void regions between elements of the transport mechanism. The exhaust basket can be positioned over the substantially flat surfaces. The method can include excess vapor in an exhaust basket.

The details of one or more embodiments are set forth in the accompanying drawings and the description below. Other features, objects, and advantages will be apparent from the description and drawings, and from the claims.

DETAILED DESCRIPTION

A vapor deposition method and system for depositing a film on a substrate has been developed and found that can result in improvements in variations in film properties and uniformity. Usual deposition methods result in leading, trailing and side edge effects due to changes in vapor flow and exposure to a surface of a substrate. Such edge effects result in variation of the thickness of film deposits on the leading, trailing and side edges of a substrate. The method and system can be useful in reducing edge effects in vapor deposition and in reducing a 'wrap around' coating. The method of reducing edge effects in vapor deposition can include introducing a fixed substantially flat surface opposite a deposition nozzle in a vapor deposition system, or can include transporting the substrate on substantially flat surfaces that are positioned in between a substrate transport mechanism. The substrate transport mechanism can be rollers. In another embodiment, a method of reducing edge effects in vapor deposition can include introducing an exhaust basket opposite a deposition nozzle in a vapor deposition system. The exhaust basket can have an intake surface extending beyond the width of a substrate when present. The exhaust basket can be connected to a source of reduced pressure to facilitate vapor deposition on a substrate. Using the systems and methods, thickness variations of the deposited layer at the edges of substrates can decrease to less than 25%, less than 20%, less than 15%, less than 10%, less than 5%, less than 1%, less than 0.5% or less than 0.1% of the average layer thickness.

Figure 1:
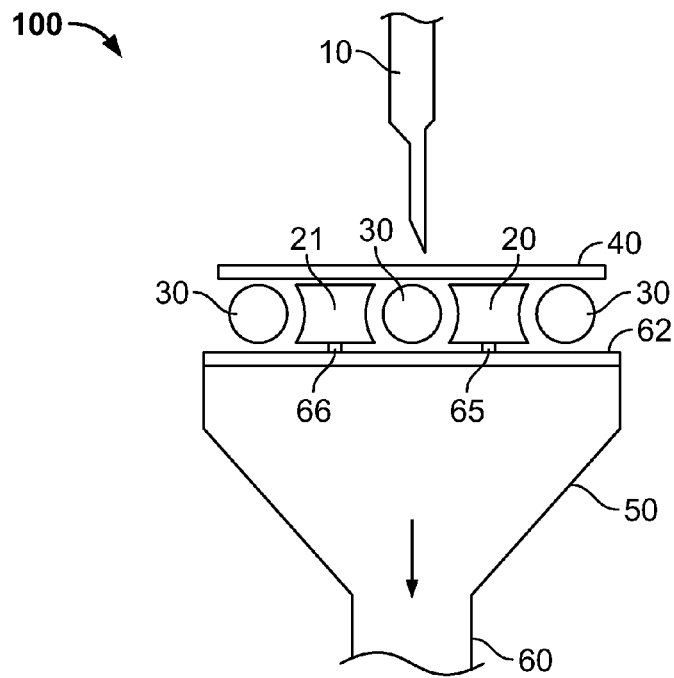
FIG. 1 is a drawing depicting an embodiment of a vapor deposition system.

With reference to FIG. 1, a vapor deposition system 100 includes a nozzle 10, a substantially flat surface 20, transport mechanism 30, a substrate 40, and an exhaust basket 50 connected to a source of reduced pressure 60. The vapor deposition system 100 includes a nozzle 10 that can be configured to introduce a vapor of a material onto a surface of a substrate 40 to coat the surface with the material. The vapor can be introduced at atmospheric pressure, at a pressure above atmospheric pressure or at a pressure below atmospheric pressure. Nozzle 10 can be positioned above a substrate 40. Substrate 40 can be a glass sheet. Substrate 40 can be heated during the processing to a substrate temperature. Substrate 40 can be transported by any appropriate transport mechanism to the vapor deposition system 100, such as rollers, or a conveyor belt, driven, for example, by an attached electric motor. Substantially flat surface 20 can be supported by bar 62 and positioned with an adjustable connector 65. Depending on the configuration of the system, a second substantially flat surface 21 can be placed in other void regions between elements of transport mechanism 30. Substantially flat surface 21 can be supported by bar 62 and positioned with an additional adjustable connector 66.

The method and system can be used to form a coating by vapor deposition, including dielectric coatings, metal coatings, and semiconductor coatings using the systems and methods described herein. Also, dopants can be included to enhance the deposition and properties of the resulting coatings or films, as appropriate. For example, the method and system can be used to deposit coatings of tin oxide or silicon dioxide on a surface of a glass substrate. The vapor can be introduced at atmospheric pressure, at a pressure above atmospheric pressure, or at a pressure below atmospheric pressure. In certain circumstances, the system can include a curtain of inert gas, such as nitrogen, that can contain and isolate the vapor to a deposition region.

The substantially flat surface can be positioned opposite the deposition nozzle. The substantially flat surface can be positioned in between a substrate transport mechanism. The substrate transport mechanism can be a roller. The substantially flat surface is used to create an air flow that is minimally disturbed when a substrate is not present. This reduces the leading and trailing edge effect on the substrate and provides less variation in film uniformity and film properties and also reduces wrap around or back surface coating. For example, the substantially flat surface or surfaces can be positioned in between at least two rollers. The plane tangential to the two rollers can be offset between 0.1 to 10 mm from the substantially flat surface. The substantially flat surfaces can be positioned in between an appropriate number of rollers depending on the desired length of the flat surface area to be presented to the nozzle or nozzle array. Alternatively, there can be multiple substantially flat surfaces in between multiple rollers. For example, there can one substantially flat surface in between at least two rollers, two substantially flat surfaces in between three rollers. The number of deposition nozzles can be equal to the number of substantially flat surfaces or there may be multiple substantially flat surfaces for each nozzle. The positioning of the substantially flat surfaces can reduce or prevent turbulence on the edges of the substrate 40 and allows for an even deposition of vapor on the edges of the substrate. The positioning of the substantially flat surface can decrease flow disturbance or allow minimal flow disturbance that can be created by lack of substrate as the backplane provides similar geometry during the entire process. Crossweb edges are also less impacted because the substantially flat surfaces provide a virtual substrate to coat in between the edge of one substrate and the edge of another substrate thereby reducing or eliminating leading and trailing edge effects as well as side edge effects. Wrap around coating of the opposite side of the substrate is also reduced.

The substrate 40 can be positioned above substantially flat surface 20. The substantially flat surfaces 20 can extend beyond the width of substrate 40 when present. For example, the width of the substantially flat surface can be more than 0.1%, more than 1%, more than 5%, more than 10%, more than 25%, more than 40%, or more than 50% greater than the width of the substrate. The substantially flat surface can also be longer than the length of the substrate. For example, the length of the substantially flat surface can be more than 0.1%, more than 1%, more than 5%, more than 10%, more than 25%, more than 40%, or more than 50% greater than the length of the substrate. The substantially flat surfaces 20 can be removable. The substantially flat surfaces can be cleaned without disassembling the entire system. The substantially flat surfaces 20 can include graphite or boron nitride or any other materials that are stable under deposition conditions. The substantially flat surfaces 20 and/or exhaust basket 50 can be configured to modify a pre-existing vapor deposition system.

Referring to FIG. 1, the vapor deposition system 100 can include an exhaust basket 50 opposite the nozzle 10. The exhaust basket can be used to collect the excess vapor or carrier gas from the system. The exhaust basket 50 can be positioned beneath the substantially flat surfaces 20. The exhaust basket 50 can be connected to a source of reduced pressure 60. The source of reduced pressure can be a vacuum pump or fan system designed to draw unreacted vapor and/or reaction products out of the deposition region of the system.

Figure 2A:
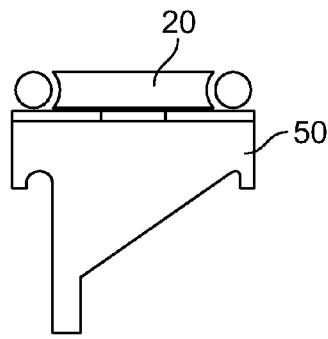
FIG. 2A is a drawing depicting an embodiment of the side view of an adjustment bar and the base of an exhaust basket.

Referring to FIG. 2A, the exhaust basket 50 can extend beyond the substantially flat surface 20 in one dimension. In certain circumstances, the exhaust basket 50 can also extend beyond the substantially flat surface 20 in a second dimension. For example, the exhaust basket can have an intake plane positioned beneath the substantially flat surface. Alternatively, the exhaust basket can have an intake plane positioned such that it is even with the substrate plane or positioned above the substrate plane.

The exhaust basket 50 can have a length that is longer than the dimension of the substantially flat surface 20. For example, the length of the exhaust basket can be more than 0.1%, more than 1%, more than 5%, more than 10%, more than 25%, more than 40%, or more than 50% greater than the corresponding length of the substantially flat surface. The exhaust basket 50 can have a width that is wider than the substantially flat surface 20 and rollers 30. For example, the width of the exhaust basket can be more than 0.1%, more than 1%, more than 5%, more than 10%, more than 25%, more than 40%, or more than 50% greater than the width of the substantially flat surface. The exhaust basket dimensions and positions are configured so that there are decreased or minimal flow changes in the vapor stream as the substrate is transported into and out of the vapor stream. This helps provide an even deposition of vapor on the edges of the substrate thereby providing improved film uniformity and quality on the surface of the substrate.

Figure 2B:
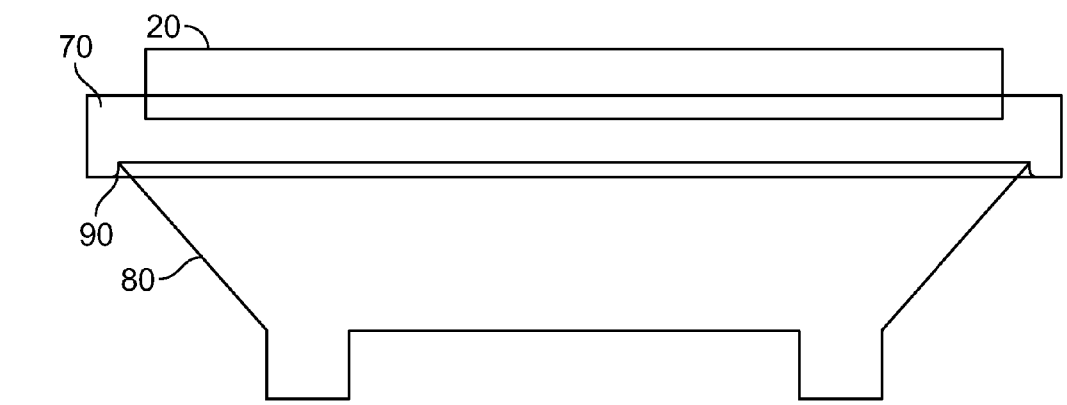
FIG. 2B is a drawing depicting an embodiment of the front view of an adjustment bar and the base of an exhaust basket.

Referring to FIG. 2B, the exhaust basket 50 can include a support bracket 70 extending across the basket, the substantially flat surface 20 being adjustably attached to the support bracket 70. The exhaust basket can also include a removable base 80. The removable base 80 can be attached to, hinged or otherwise places on the support bracket 70. Referring to FIG. 2B, the removable base 80 can be hinged onto a lip 90 on the support bracket 70. The removable base 80 can be positioned so that it is easily accessed and cleaned. The exhaust basket 50 has a dimension greater than the substantially flat surface 20. The exhaust basket can include a lip that brings the edges up to the same plane as the surfaces of the substantially flat plate, or above the plane. The basket shape can be modified, for example, edge height, gap from edge of flat plates, or gap from transport mechanism, etc., to improve the quality of the coated substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A system for depositing a material on a substrate, comprising:
    a deposition nozzle configured to deposit a first portion of a vapor of a material as a film on a first surface of the substrate;
    a transport mechanism configured to transport the substrate past the nozzle;
    a first substantially flat surface opposite the nozzle and in a void region between elements of a transport mechanism;
    a second substantially flat surface in a second void region between elements of a transport mechanism and adjacent to the first substantial flat surface; wherein the first and the second substantially flat surfaces are positioned with its own individual adjustable connector; and
    an exhaust basket positioned substantially directly beneath the first substantially flat surface, wherein the exhaust basket is connected to a source of reduced pressure, the exhaust basket having an intake, the intake positioned beneath the nozzle and opposite a second surface of the substrate and above the source of reduced pressure, and extending beyond the width of the substrate and configured to receive a second portion of the vapor from the deposition nozzle which is not deposited on the first surface of the substrate.

2. The system of claim 1, wherein a plane tangential to the transport mechanism is offset between 0.1 to 10 mm from the substantially flat surface.

3. The system of claim 1, wherein the substantially flat surface includes graphite or boron nitride.

4. The system of claim 1, wherein the substantially flat surface is removable.

5. The system of claim 4, wherein the exhaust basket extends beyond the substantially flat surface in one dimension.

6. The system of claim 5, wherein the exhaust basket extends beyond the substantially flat surface in a second dimension.

7. The system of claim 4, wherein the exhaust basket includes a removable base.

8. The system of claim 1, wherein the substantially flat surface extends beyond the width of the substrate when present.

9. The system of claim 8, wherein the exhaust basket comprises an bar extending across the basket, the adjustable connector being attached to the bar.

10. The system of claim 1, further comprising a plurality of substantially flat surfaces positioned in a plurality of corresponding void regions between elements of the transport mechanism.

11. A vapor deposition system comprising:
    a vapor nozzle positioned above a substrate and configured to deposit at least a portion of a vapor material as a film on a first surface of the substrate;
    substantially flat surfaces opposite the nozzle, the substrate positioned above the substantially flat surfaces, wherein the substantially flat surfaces are placed in between portions of a substrate transport mechanism and wherein each substantially flat surface is positioned with its own individual adjustable connector; and
    an exhaust basket positioned substantially directly beneath the first substantially flat surface, wherein the exhaust basket is connected to a source of reduced pressure, the exhaust basket having an intake, the intake positioned beneath the nozzle and opposite a second surface of the substrate and above the source of reduced pressure, and extending beyond the width of the substrate and configured to receive the vapor not deposited on the first surface of the substrate by the vapor nozzle.

12. The vapor deposition system of claim 11, wherein a plane tangential to the substrate transport mechanism is offset between 0.1 and 10 mm from the substantially flat surfaces.

13. The vapor deposition system of claim 11, wherein the substantially flat surfaces are removable.

14. The vapor deposition system of claim 11, wherein the exhaust basket has a length that is longer than the dimension of the substantially flat surface.

15. The vapor deposition system of claim 11, wherein the exhaust basket has a width that is wider than the substantially flat surface and the transport mechanism.

16. The vapor deposition system of claim 11, wherein the exhaust basket is removable.

* * * * *